United States Patent
Wan et al.

(10) Patent No.: US 8,421,660 B1
(45) Date of Patent: Apr. 16, 2013

(54) CONFIGURABLE CASCADING SIGMA DELTA ANALOG-TO DIGITAL CONVERTER (ADC) FOR ADJUSTING POWER AND PERFORMANCE

(75) Inventors: Ho Ming (Karen) Wan, Hong Kong (HK); Yat To (William) Wong, Hong Kong (HK); Kwai Chi Chan, Hong Kong (HK); Andrea Baschirotto, Tortona (IT)

(73) Assignee: Hong Kong Applied Science & Technology Research Institute Company., Ltd., Hong Kong (HK)

( * ) Notice: Subject to any disclaimer, the term of this patent is extended or adjusted under 35 U.S.C. 154(b) by 35 days.

(21) Appl. No.: 13/304,526

(22) Filed: Nov. 25, 2011

(51) Int. Cl.
*H03M 3/00* (2006.01)

(52) U.S. Cl.
USPC ............ 341/143; 341/118; 341/120; 341/155

(58) Field of Classification Search .................. 341/118, 341/120, 143, 155
See application file for complete search history.

(56) References Cited

U.S. PATENT DOCUMENTS

| | | | | |
|---|---|---|---|---|
| 5,075,679 | A * | 12/1991 | Gazsi | 341/143 |
| 5,150,120 | A * | 9/1992 | Yunus | 341/143 |
| 6,154,161 | A * | 11/2000 | Leme et al. | 341/143 |
| 6,518,905 | B2 * | 2/2003 | Siferd | 341/143 |
| 6,538,588 | B1 * | 3/2003 | Bazarjani | 341/143 |
| 6,577,259 | B1 * | 6/2003 | Jelonnek | 341/143 |
| 6,765,517 | B1 | 7/2004 | Ali | |
| 6,801,148 | B2 * | 10/2004 | Freeman et al. | 341/143 |
| 6,914,549 | B2 | 7/2005 | Chen et al. | |
| 7,199,738 | B2 * | 4/2007 | Han et al. | 341/143 |
| 7,532,141 | B2 * | 5/2009 | Kitahira et al. | 341/152 |
| 7,554,472 | B2 * | 6/2009 | Puma | 341/143 |
| 7,812,757 | B1 | 10/2010 | Wong et al. | |
| 8,203,475 | B2 * | 6/2012 | Hossain et al. | 341/143 |
| 2012/0127009 | A1 * | 5/2012 | Pagnanelli | 341/143 |

OTHER PUBLICATIONS

Yavari, M., et al., "A 3.3-V 18-bit digital audio sigma-delta modulator in 0.6μm CMOS", IEEE Int. Symposium Circuits Systems, vol. 2, pp. 640-643, May 2002.

* cited by examiner

*Primary Examiner* — Linh Nguyen
(74) *Attorney, Agent, or Firm* — Stuart T. Auvinen; gPatent LLC (57) ABSTRACT

A cascaded sigma-delta modulator has several modulator loops that have one or two sets of integrators, summers, and scalers, and a quantizer that generates a loop output. Input muxes to each loop select either an overall input or the loop output from a prior loop, allowing the modulator loops to be cascaded in series or to operate separately. Filter-configuring muxes after each modulator loop select either that loop's output or a loop output from any prior loop, or a zero. Each filter-configuring mux drives an input to a modified CIC filter. The modified CIC filter has an initial delay stage that receives the first filter-configuring mux output, and successive integrator stages that each receives a successive filter-configuring mux output. The modified CIC filter is a combination of a digital transform filter and a Cascaded-Integrator-Comb (CIC) filter. Modulator loops are powered down for lower-performance configurations or cascaded together for higher-performance configurations.

20 Claims, 12 Drawing Sheets

CONFIGURABLE CASCADING SIGMA DELTA ANALOG-TO DIGITAL CONVERTER (ADC) FOR ADJUSTING POWER AND PERFORMANCE

FIELD OF THE INVENTION

This invention relates to digital sigma-delta modulator circuits, and more particularly to re-configurable sigma-delta modulators.

BACKGROUND OF THE INVENTION

Over-sampled sigma-delta modulators are widely used in consumer audio and precision measurement devices. Signal processing is performed in the digital domain rather than in the analog domain, allowing for power savings and performance improvements as semiconductor processes improve. The modulator samples the input signal at a much higher frequency and spreads noise over a wider frequency band. A digital filter then decimates and filters the over-sampled data to remove the noise from the signal band.

Figure 1:
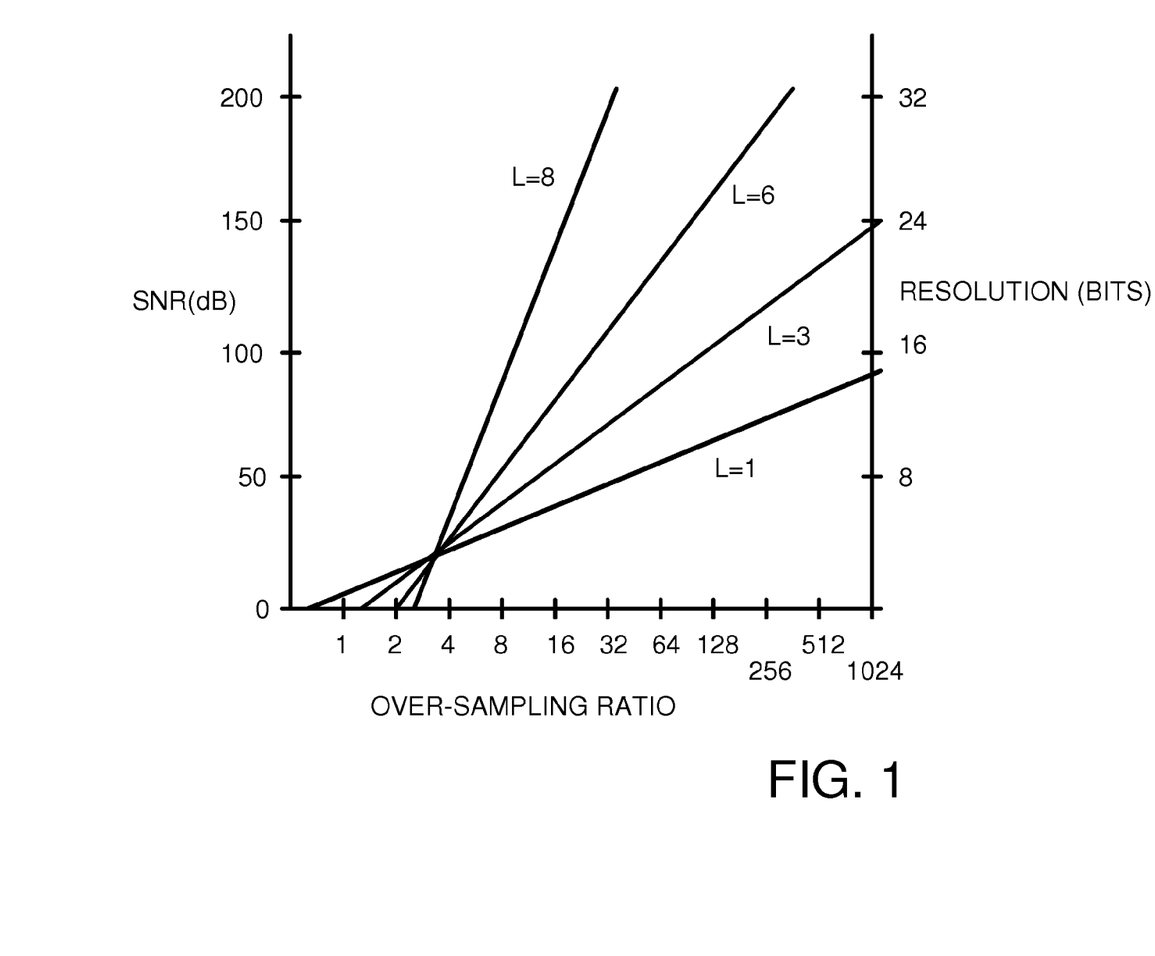
FIG. 1 is a graph of modulator noise rejection as a function of the order of the modulator.

FIG. 1 is a graph of modulator noise rejection as a function of the order of the modulator. The performance of a high-order over-sampled sigma-delta modulator is a function of the over-sampling ratio (OSR) and the order (L) of the modulator. The order of the modulator is the number of integrators cascaded together in a loop. FIG. 1 shows that higher-order modulators have a better signal-to-noise ratio for a given over-sampled ratio, and can be used for Analog-Digital Converters of higher precision (more bits of resolution). However, higher-order modulators tend to be unstable since oscillations occur for larger input levels.

In a Multi-stage noise-Shaped (MASH) sigma-delta modulator, the outputs from several low-order modulator loops are combined by a filter, such as a digital transfer function filter. The low-order loops are stable and cascaded together. The first stage may be constructed from larger transistors and capacitors to reduce thermal and op amp noise. However, this larger first stage also consumes more power than later stages constructed from smaller transistors and capacitors. Thus the first stage tends to provide a higher resolution while consuming more power than later stages, which have lower performance and lower power consumption.

Portable systems such as smart phones may use two or more sigma-delta modulators may be required for different applications. For example, a high-resolution sigma-delta modulator may be needed for playback of high-quality music recordings such as from a MP3 player, but a low-resolution sigma-delta modulator is better for reconstructing voice messages from telephone calls. During telephone calls the portable device's battery is being drained by the Radio-Frequency (RF) transceivers, so a lower power draw from the sigma-delta modulator is desirable at that time.

What is desired is a sigma-delta modulator that is adaptable for different applications. A configurable sigma-delta modulator is desired that can be configured for low-power lower-resolution applications and re-configured for high-power, high-resolution applications. A cascaded sigma-delta modulator that can power-down integrator loops and reconfigure connections to the remaining integrator loops and inputs to a digital filter is desirable.

DETAILED DESCRIPTION

The present invention relates to an improvement in configurable sigma-delta modulators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
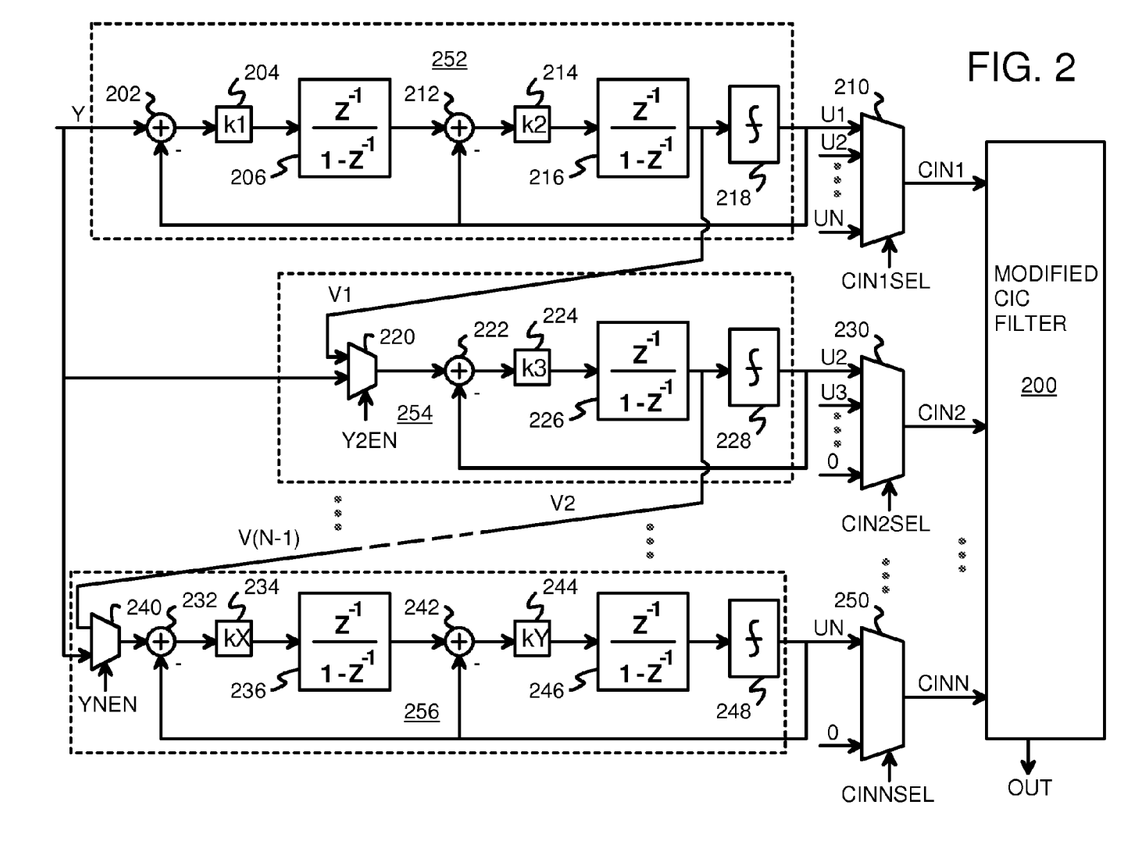
FIG. 2 is a block diagram of a configurable cascaded sigma-delta modulator with a modified CIC filter.

FIG. 2 is a block diagram of a configurable cascaded sigma-delta modulator with a modified CIC filter. An analog input Y is applied to three sigma-delta modulator loops 252, 254, 256. Loops 252, 256 are second order, each having two integrators 206, 216, and 236, 246, while middle loop 254 is first order, having one integrator 226.

In first loop 252, summer 202 subtracts feedback U1 that is output from loop 252 from the input Y. The sum is multiplied with parameter k1 by scaler 204 and then integrated by integrator 206. Parameters may be constants or values that are predetermined, but may be changed for different applications and configurations. Since loop 252 is second order, this process is repeated by summer 212, scaler 214 (with parameter k2), and integrator 216. Quantizer 218 is a 1-bit quantizer, differentiator, delta function or single-bit digital-to-analog converter (DAC) that generates output U1. Once the output of integrator 216 reaches a threshold value of quantizer 218, quantizer 218 sets its output U1 high. U1 represents the sampled input Y and is fed back to summers 202, 212 to form a feedback loop.

In second loop 254, input mux 220 selects either input Y or feedback V1 in response to configuration signal Y2EN. Feedback V1 is taken from the input to quantizer 218 in first loop 252. Summer 222 subtracts feedback U2 that is output from second loop 254 from the input selected by input mux 220. The sum is multiplied with parameter k3 by scaler 224 and then integrated by integrator 226. Since loop 254 is first order, there is only one integrator. Quantizer 228 is a single-bit quantizer, differentiator, delta function or single-bit DAC that generates output U2.

Additional loops may be present between loops 245 and 256. Each loop except first loop 252 has an input mux 220, 240 that selects either analog input Y or the feedback from the prior loop. When the prior loop's feedback is selected, the loops are cascaded in series. When the analog input Y is selected, the loops are in parallel, or are disabled.

In Nth loop 256, input mux 240 selects either input Y or feedback V(N−1) in response to configuration signal YNEN. Feedback V(N−1) is the feedback from the prior loop, such as V2 from loop 254 when N=3 loops.

Summer 232 subtracts feedback UN output from loop 256 from the output of input mux 240. The sum is multiplied with parameter kX by scaler 234 and then integrated by integrator 236. Since loop 256 is second order, this process is repeated by summer 242, scaler 244 (with parameter kY), and integrator 246. Quantizer 248 is a single-bit quantizer, differentiator, delta function or single-bit DAC that generates output UN.

Modified Cascaded-Integrator-Comb (CIC) filter 200 is a CIC filter that is combined with a digital transfer function filter. Some components cancel out, such as differentiators and integrators, allowing for a more streamlined single filter 200.

The inputs to modified CIC filter 200 are each selected by a mux. First input CIN1 is selected by filter-configuring mux 210, which selects any of the loop outputs U1, U2, . . . UN from any of loops 252, 254, . . . 256. Configure signal CIN1SEL is a multi-bit signal that selects one of U1, U2, . . . UN to apply as input CIN1 to modified CIC filter 200.

Second input CIN2 is selected by filter-configuring mux 230, which selects any of the loop outputs U2, . . . UN from any of loops 254, . . . 256. However, the outputs (U1) of prior loops such as loop 252 are not selectable by mux 230. Also, mux 230 may select a zero input. The zero input is selected by the later muxes when some of the loops are disabled, and not all of the inputs to modified CIC filter 200 are used. Configure signal CIN2SEL selects one of U2, . . . UN, or 0 to apply as input CIN2 to modified CIC filter 200.

Final input CNN is selected by filter-configuring mux 250. Configure signal CINNSEL causes mux 250 select either final loop outputs UN from loop 256, or zero.

Loop outputs U1, U2, . . . UN and filter output OUT are digital signals while feedback signals V1, V2, . . . V(N−1) and input Y are analog signals.

Figure 3:
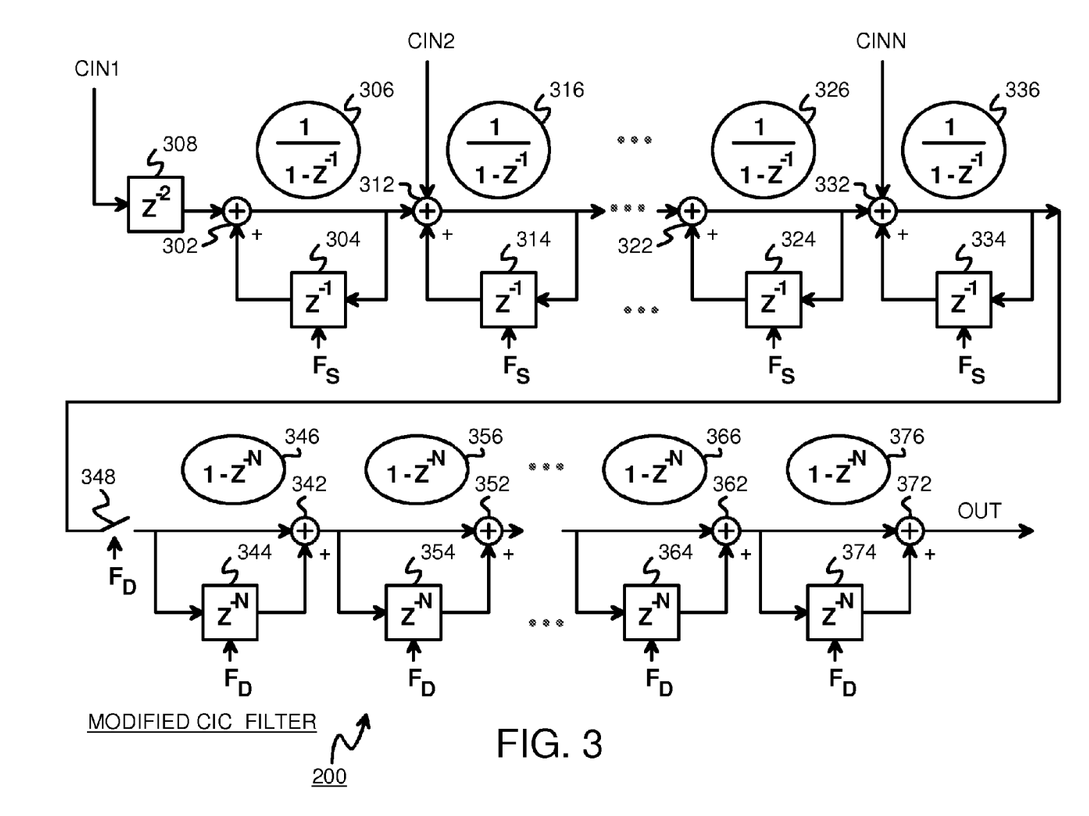
FIG. 3 is a diagram of a modified CIC filter with multiple configurable inputs.

FIG. 3 is a diagram of a modified CIC filter with multiple configurable inputs. Modified CIC filter 200 is a logical combination of a digital transfer function and a Cascaded-Integrator-Comb (CIC) filter. The digital transfer function has delays for the first loop's output U1 and cascades of differentiators for the other loops' outputs U2, U3, . . . UN. The number of delays or differentiators cascaded together depends on the order of each loop.

A CIC filter has a cascade of comb stages and integrator stages. When the digital transfer function is combined with a CIC filter, the differentiators in the digital transfer function cancel out the integrators in the CIC filter, providing for a simpler combined structure.

Modified CIC filter 200 has an extra delay stage on the first input CIN1, first delay stage 308. The output of first delay stage 308 feeds the first integrator stage, which includes summer 302 and feedback delay 304, which is clocked by sampling clock of sampling frequency Fs. Summer 302 and feedback delay 304 together act as integrator 306.

In the second integrator stage, the second configurable input CIN2 is applied to summer 312, which adds configurable input CIN2 to the output of the first integrator and adds the feedback from feedback delay 314 in second integrator 316.

Other integrator stages 326 may follow, each having a summer 322 that adds a configurable input CINx to the output from the prior integrator stage and adds feedback from feedback delay 324. Final integrator stage 336 has summer 332 that adds final configurable filter input CINN to the prior integrator stage and subtracts feedback from feedback delay 334.

Switch 348 is clocked by a decimating clock with a down-sampled frequency Fd. The down-sampling ratio may be chosen by design, such as 64, so that Fd is 250 KHz when Fs is 16 MHz, as one example of the many possibilities. The integrated and sampled signal is then passed through a cascade of comb stages 346, 356, 366, 376. Each comb stage 346 has a summer 342 that subtracts a delayed feed-through from feed-through delay 344. The final summer 372 outputs the reconstructed digital signal OUT. Further filtering or conversion of signal OUT may be performed, such as additional decimation.

The number of comb stages is equal to the number of integrator stages in modified CIC filter 200.

Figure 4:
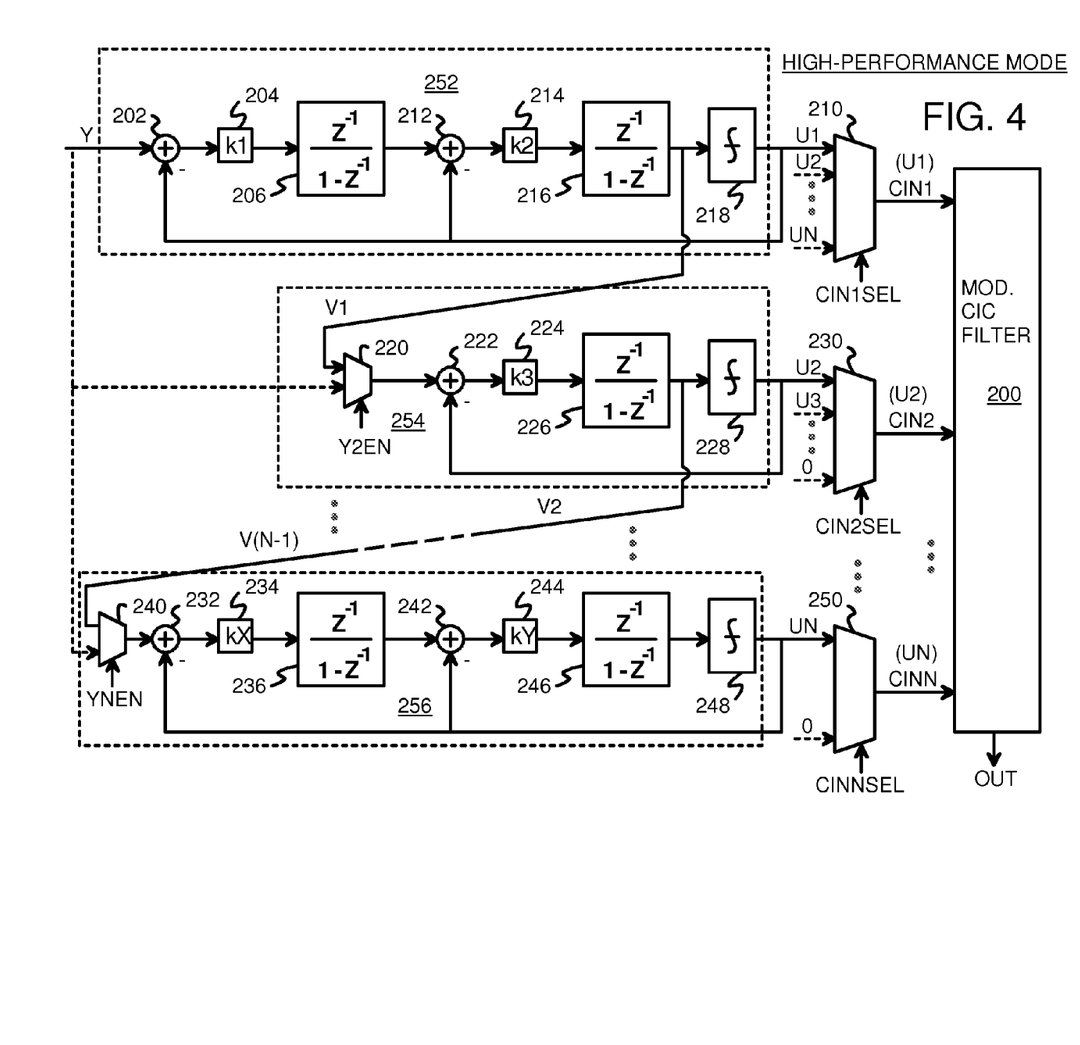
FIG. 4 shows the configurable cascaded sigma-delta modulator and filter configured for a high-performance mode.

FIG. 4 shows the configurable cascaded sigma-delta modulator and filter configured for a high-performance mode. Dashed signal lines indicate non-selected signals. First filter-configuring mux 210 selects signal U1 generated by first loop 252 for input to modified CIC filter 200 as the first configurable input CIN1. Second filter-configuring mux 230 selects signal U2 generated by second loop 254 for input to modified CIC filter 200 as the second configurable input CIN2. Final filter-configuring mux 250 selects signal UN generated by final loop 256 for input to modified CIC filter 200 as the final configurable input CINN. Other intermediate filter-configuring muxes (not shown) select their loop's output for input to intermediate taps to modified CIC filter 200.

Analog input Y is applied to first loop 252, but is not selected for any other loops. Instead, input mux 220 selects feedback V1 from first loop 252 for input to second loop 254. Input mux 240 selects feedback V(N−1) from prior loop N−1 for input to final loop 256. Thus loops 252, 254, 256 are cascaded together in series.

The power consumed is at a maximum, since all loops 252, 254, 256 are powered up and operating upon the prior loop's output. The signal-to-noise ratio is high since performance is improved by the use of many cascaded loops.

Figure 5:
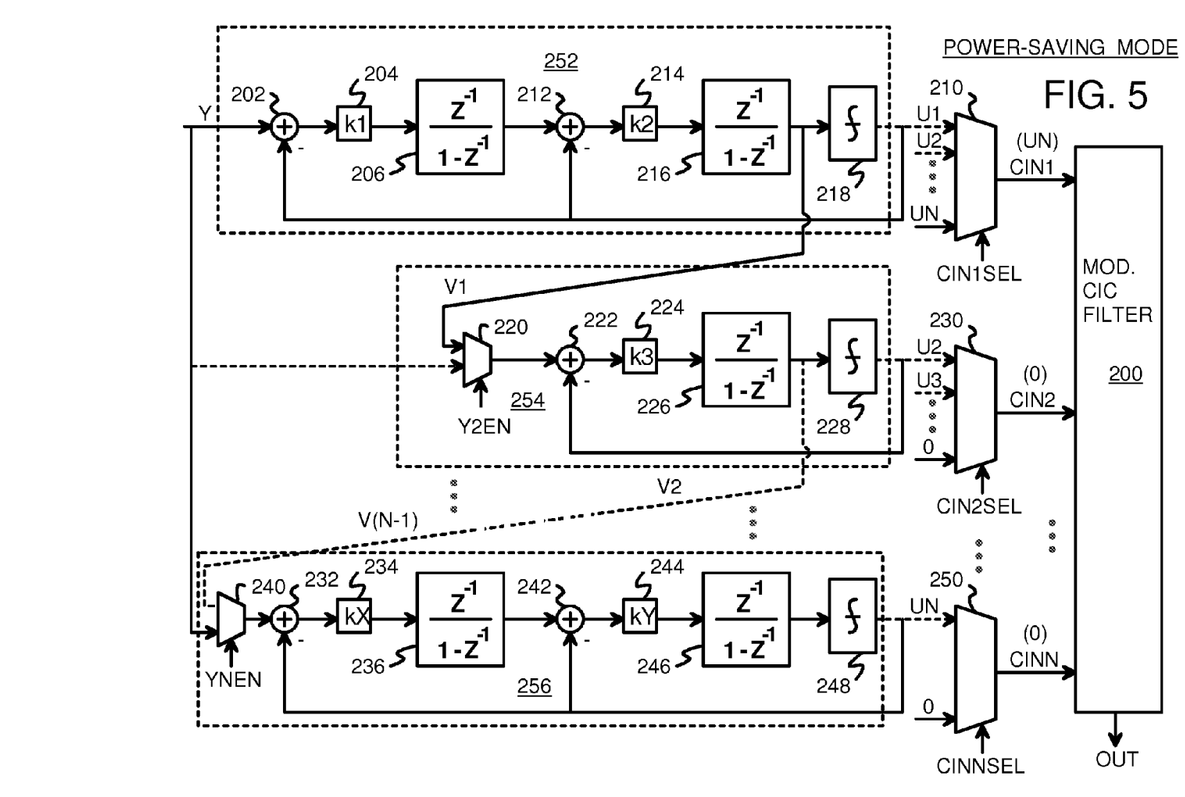
FIG. 5 shows the configurable cascaded sigma-delta modulator and filter configured for a power-saving mode.

FIG. 5 shows the configurable cascaded sigma-delta modulator and filter configured for a power-saving mode. Dashed signal lines indicate non-selected signals.

Only the last loop 256 is powered up. First loop 252 and second loop 254 and any other intermediate loops are powered down. The outputs U1, U2, . . . from these loops are irrelevant and unused and not selected by filter-configuring muxes 210, 230, . . . Instead, filter-configuring mux 210 select final loop output UN to apply to first filter input CIN1. Other inputs CIN2, . . . CINN to modified CIC filter 200 are zero, since muxes 230, . . . 250 select their zero inputs.

Input mux 240 selects analog input Y and ignores feedback V(N−1) from prior loop N−1 for input to final loop 256. Only final loop 256 is powered up, saving the power normally consumed by loops 252, 254. While the power consumed is low, performance such as the signal-to-noise ratio is reduced, which may be acceptable for some applications such as telephone voice.

Figure 6:
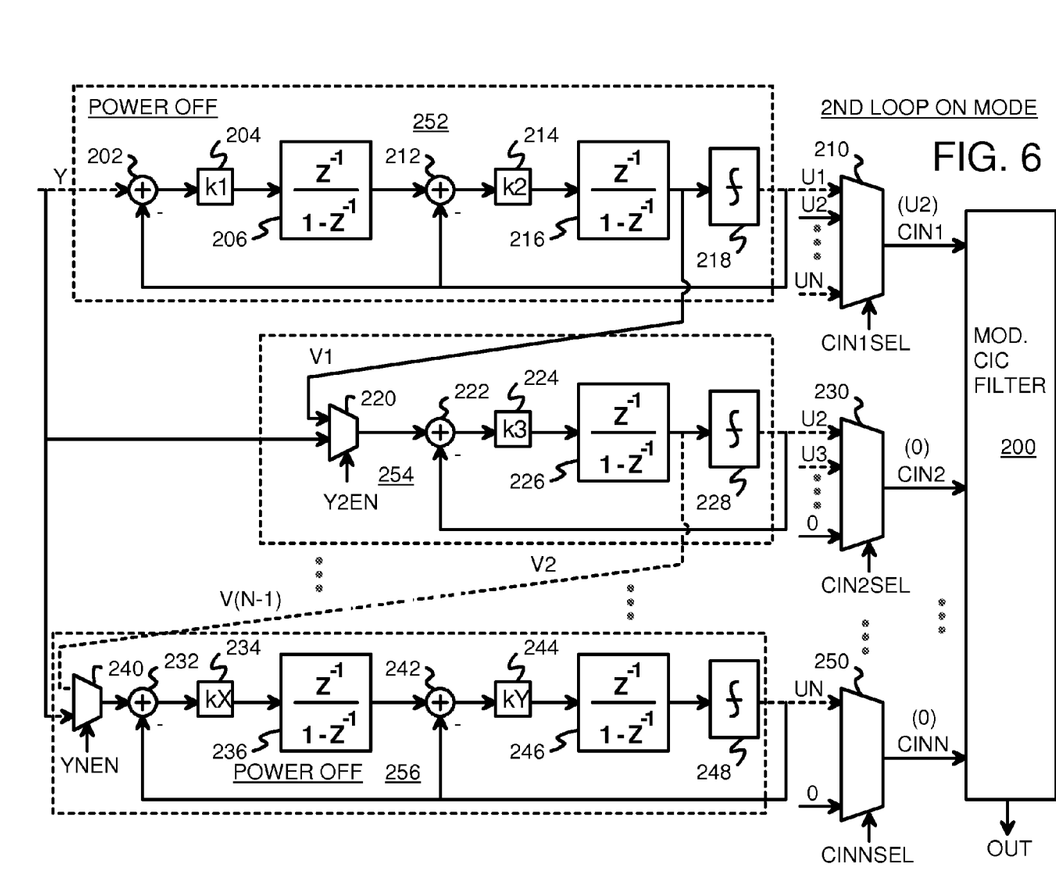
FIG. 6 shows the configurable cascaded sigma-delta modulator and filter configured for a second-loop power-saving mode.

FIG. 6 shows the configurable cascaded sigma-delta modulator and filter configured for a second-loop power-saving mode. Dashed signal lines indicate non-selected signals.

Only the second loop 254 is powered up. First loop 252 and final loop 256 and any other intermediate loops are powered down. The outputs U1, UN from these loops are irrelevant and unused and not selected by filter-configuring muxes 210, 230, ... 250. Instead, filter-configuring mux 210 select second loop output U2 to apply to first filter input CIN1. Other inputs CIN2, ... CINN to modified CIC filter 200 are zero, since muxes 230, ... 250 select their zero inputs.

Input mux 220 selects analog input Y and ignores feedback V1 from first loop 252 for input to second loop 254. Only second loop 254 is powered up, saving the power normally consumed by loops 252, 256. While the power consumed is low, performance such as the signal-to-noise ratio is reduced, which may be acceptable for some applications such as telephone voice.

Note that second loop 254 has only one integrator 226 in this embodiment, so the power consumed during this mode shown in FIG. 6 should be lower than the power consumed by the mode of FIG. 5, since final loop 256 as two integrators 236, 246.

Figure 7:
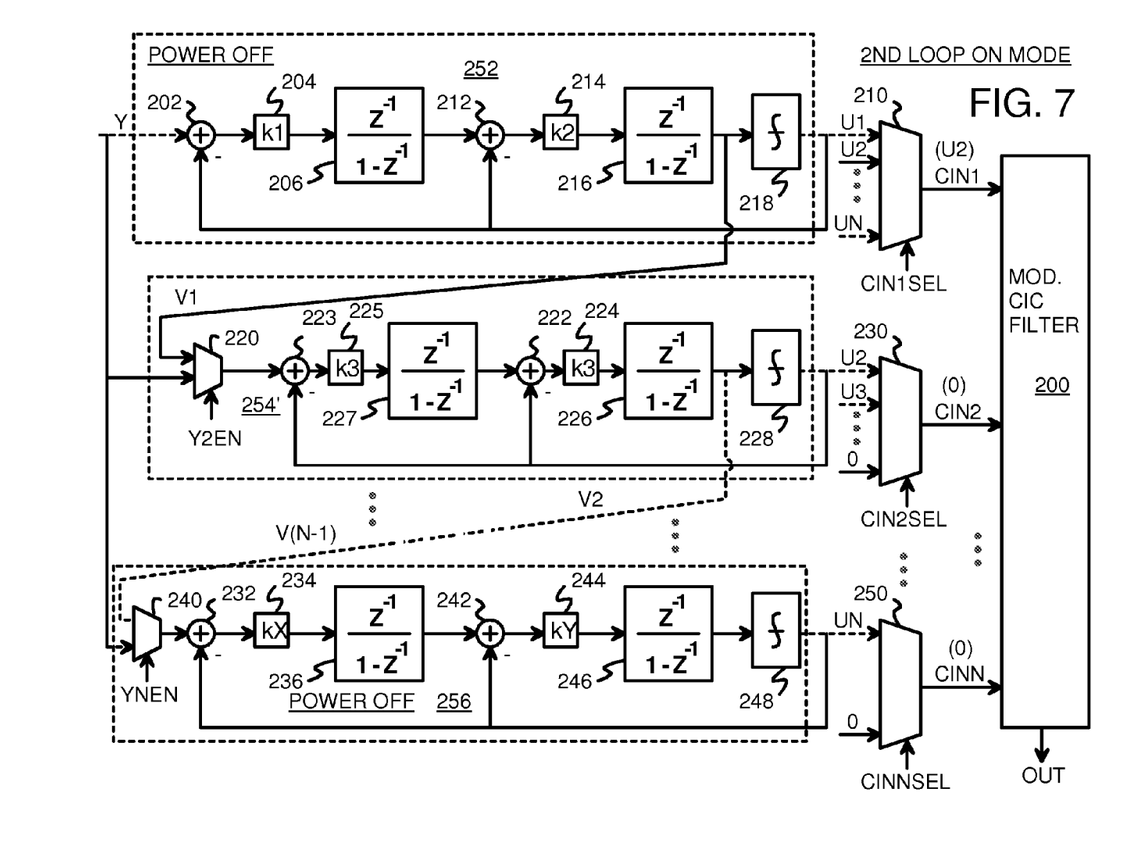
FIG. 7 shows the configurable cascaded sigma-delta modulator and filter configured for a second-loop mode with two integrators.

FIG. 7 shows the configurable cascaded sigma-delta modulator and filter configured for a second-loop mode with two integrators. Dashed signal lines indicate non-selected signals.

Only the second loop 254' is powered up. First loop 252 and final loop 256 and any other intermediate loops are powered down. The outputs U1, UN from these loops are irrelevant and unused and not selected by filter-configuring muxes 210, 230, ... 250. Instead, filter-configuring mux 210 select second loop output U2 to apply to first filter input CIN1. Other inputs CIN2, ... CINN to modified CIC filter 200 are zero, since muxes 230, ... 250 select their zero inputs.

Input mux 220 selects analog input Y and ignores feedback V1 from first loop 252 for input to second loop 254. Only second loop 254 is powered up, saving the power normally consumed by loops 252, 256. While the power consumed is low, performance such as the signal-to-noise ratio is reduced, which may be acceptable for some applications such as telephone voice.

Second loop 254 is a second order loop with two integrators 226, 227 in this embodiment, so the power consumed during this mode shown in FIG. 7 should be higher than the power consumed by the mode of FIG. 6. Summer 223 and scaler 225 are also added components that consumer additional power.

Figure 8:
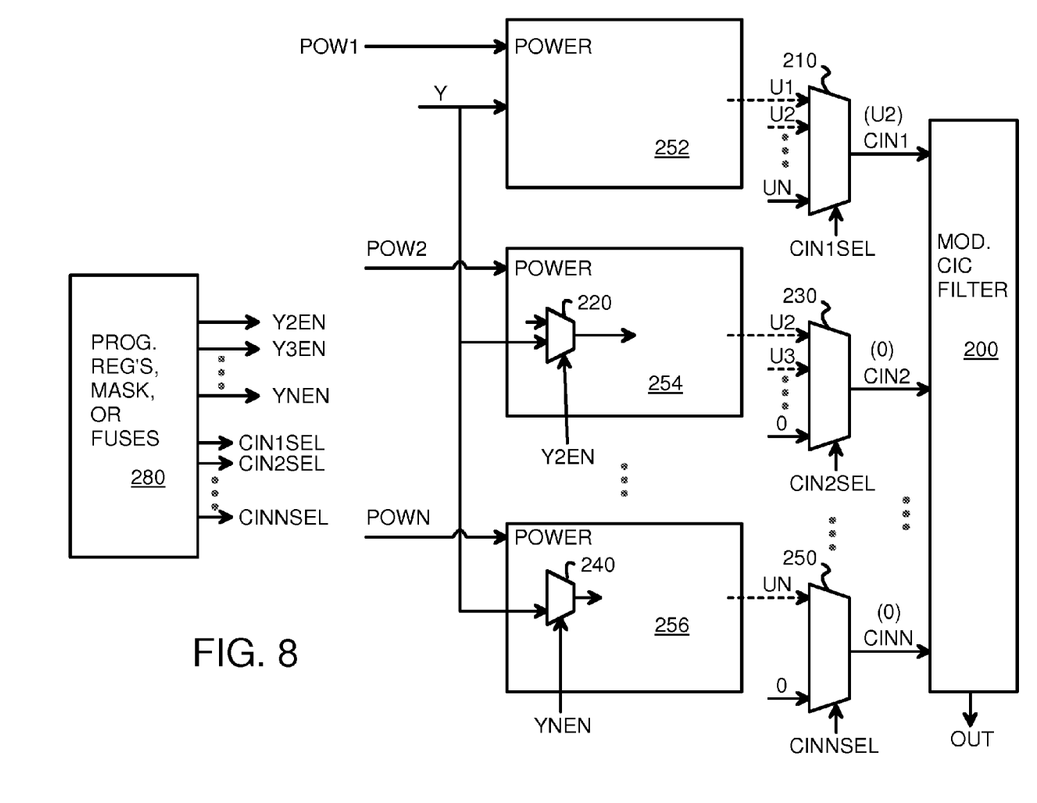
FIG. 8 highlights programming of the filter-configuring muxes and input muxes to re-configure the sigma-delta modulator and modified CIC filter.

FIG. 8 highlights programming of the filter-configuring muxes and input muxes to re-configure the sigma-delta modulator and modified CIC filter. Internal power signal POW1 is applied to control power to first loop 252. POW1 could be a switched power supply signal, or could control a switch that connects an internal power line to the internal power lines within first loop 252. Other power signals POW2, POWN are applied to second loop 254 and final loop 256.

Input mux 220 is controlled by signal Y2EN, which is output by programmable registers 280. Likewise, input mux 240 is controlled by signal YNEN from programmable registers 280. First filter-configuring mux 210 is controlled by signal CIN1SEL to select one of U1, U2, U3, ... UN to apply to the first tap input CIN1 of modified CIC filter 200. Other control signals CIN2SEL to second filter-configuring mux 230 and CINNSEL to final filter-configuring mux 250 are also output by programmable registers 280.

Programmable registers 280 can be user-programmable registers, such registers that are read and written by commands sent over a parallel or serial bus, such as Serial-Peripheral Interface (SPI) or Inter-IC (I2C) buses, or may be mask or fuse programmable signals. Additional logic (not shown) may decode mode signals that indicate which loops are on and off, into mux control signals and power signals. Sequencing signals or counters may be used to turn power on and off with delays to prevent errors.

Figure 9:
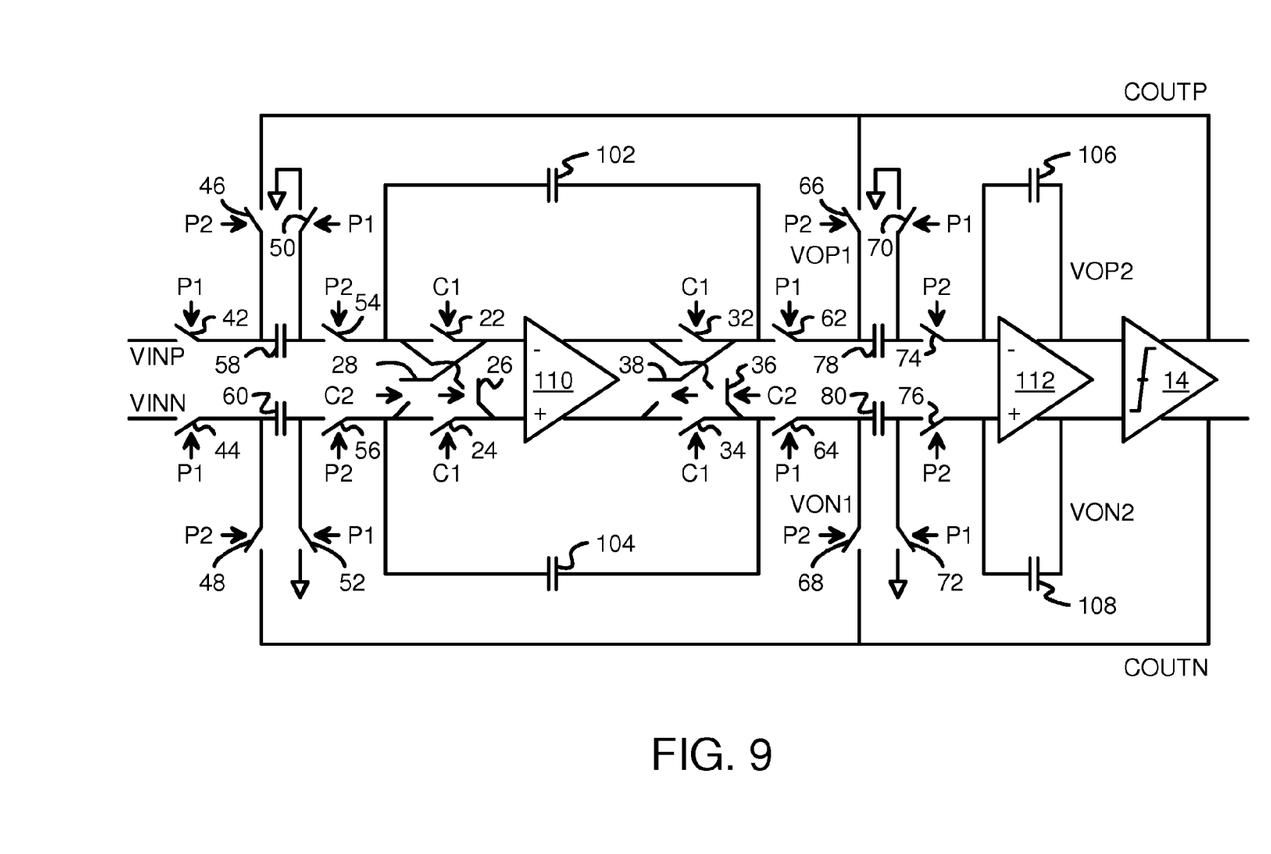
FIG. 9 is a schematic of a switched-capacitor integrator for implementing a first-order sigma-delta modulator loop.

FIG. 9 is a schematic of a switched-capacitor integrator for implementing a second-order sigma-delta modulator loop. A differential input signal VINP, VINN is applied to switches 42, 44, which are closed in phase P1 to charge capacitors 58, 60. Switches 50, 52 also close during P1 to ground the back plate of capacitors 58, 60.

During phase P2, switches 42, 44, 50, 52 open and switches 54, 56 close to pass the charge stored on capacitors 58, 60 to the inputs of op amp 110. Non-overlapping chopper clocks C1, C2 are applied to switches 22, 24, 26, 28 to either pass through or reverse the signals applied to inverting and non-inverting inputs of op amp 110. Similar chopper switches 32, 34, 36, 38 are on the outputs of op amp 110. Feedback capacitors 102, 104 connect the inputs and outputs of op amp 110 for a configuration with a gain of k1, where k1 is the ratio of capacitor 58 and capacitor 102.

A second summer and integrator is coupled to the output of op amp 110 by switches 62, 64, which are also closed during phase P1, and by capacitors 78, 80. Grounding switches 70, 72 are closed during P1. During phase P2, switches 62, 64, 70, 72 open and switches 74, 76 close to pass the charge stored on capacitors 78, 80 to the inputs of second op amp 112. Feedback capacitors 106, 108 connect the inputs and outputs of second op amp 112 for a configuration with a gain of k2, where k2 is the ratio of capacitor 78 and capacitor 106.

Quantizer 14 receives the outputs VOP2, VON2 of second op amp 112 and generates differential output COUTP, COUTN. Once the difference between VOP2 and VON2 reaches a threshold, quantizer 14 toggles COUTP, COUTN, driving one high and the other low.

COUTP, COUTN are the U1 output to filter-configuring mux 210 for first loop 252. COUTP, COUTN are fed back to switches 46, 48 for the first summer, and to switches 66, 68 for the second summer functions. Signals VOP2, VON2 are the V1 feedback signals to the second loop of FIGS. 4-7.

Op amp 110 and surrounding components act as a first integrator, while op amp 112 and its surrounding components act as a second integrator. Summing of feedback signals is provided by switches 46, 48 to capacitors 58, 60, acting as the first summer, and by switches 66, 68 to capacitors 78, 80, acting as the second summer. Scaling may be provided by the capacitor ratios. For each switched capacitor integrator, $$vout(z) = \frac{C_{sampling}}{C_{integrating}} \times \frac{V1(z)z^{-1} - V2(z)z^{-1/2}}{1 - z^{-1}}$$

where V1 is the input voltage, while V2 is either VDD or GND depending on the quanitizer's feedback. The Z transform is a complex frequency domain representation of a discrete time signal. $z^{-1}$ represents one delay in the discrete time domain, while $z^{-1/2}$ represents ½ delay in the discrete time domain.

Figure 10:
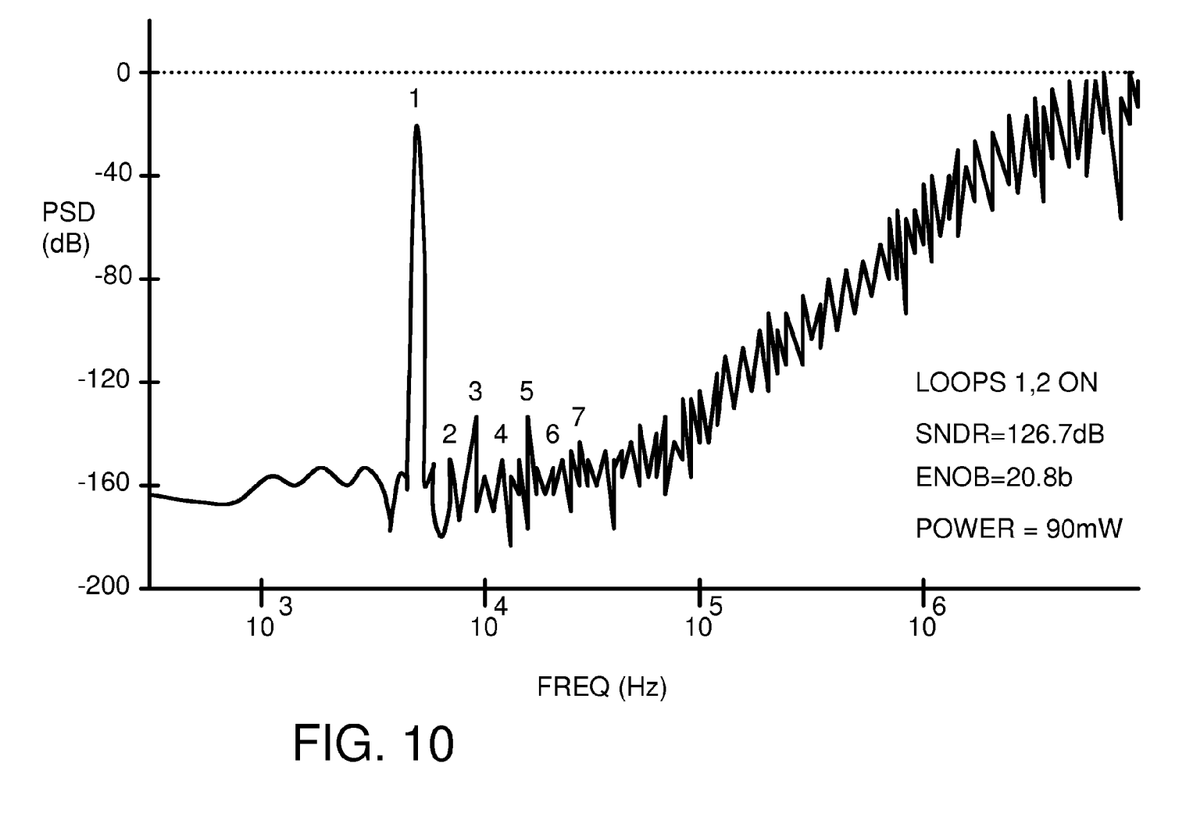
FIG. 10 is a plot of signal performance for a high-performance mode.

FIG. 10 is a plot of signal performance for a high-performance mode. The circuit of FIG. 7 is operated in the high-performance mode of FIG. 4 with all loops on. Peaks occur at the fundamental frequency and at odd harmonics. However, the Power-Spectral Density (PSD) remains low to about 50,000 Hz, indicating a good signal-to-noise ratio. The power consumed is 90 mW, and the Signal-to-Noise and Distortion Ratio (SNDR) is 126.7 dB and the Equivalent Number of Bits (ENOB) of resolution is 20.8 bits.

Figure 11:
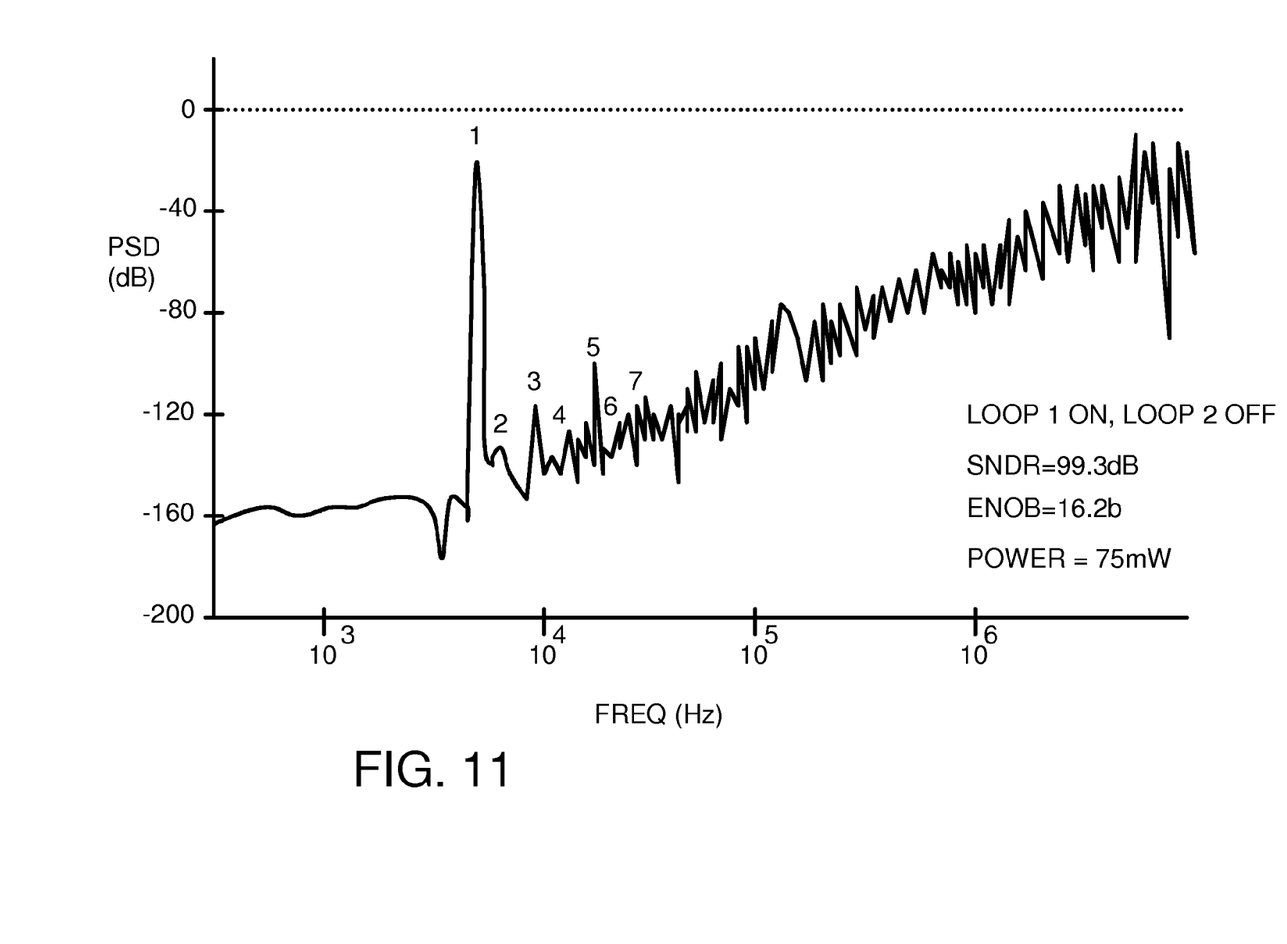
FIG. 11 is a plot of signal performance for a medium-performance mode.

FIG. 11 is a plot of signal performance for a medium-performance mode. The circuit of FIG. 7 is operated with first loop 252 on, and all other loops off. The PSD rises continuously from the fundamental peak, rather than remaining low as in FIG. 10, so signal-to-noise performance is worse. However, the power consumed is reduced from 90 mW to 75 mW. SNDR is 99.3 dB and the ENOB of resolution is 16.2 bits. Thus 15 mW are saved but about 27 dB is lost, or more than 4 bits of resolution.

Figure 12:
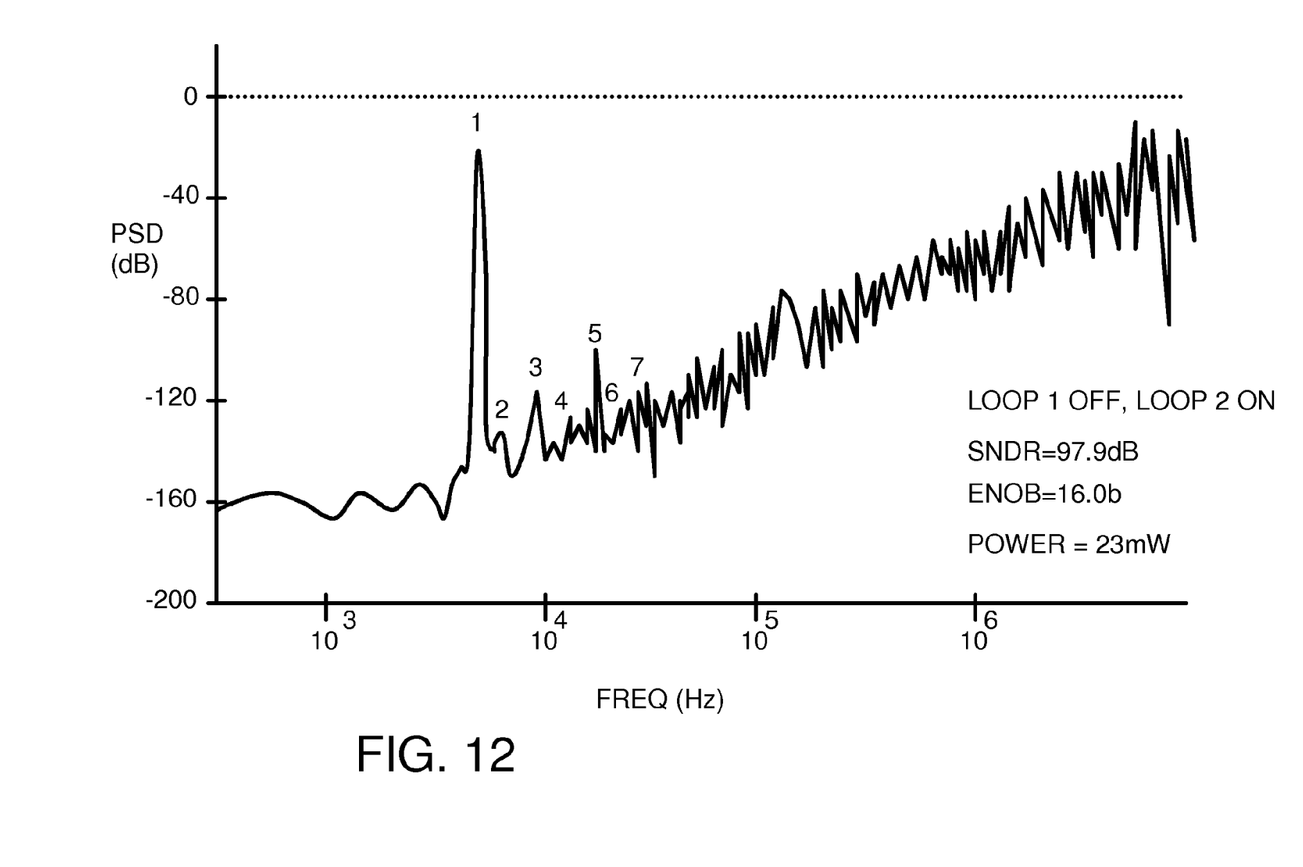
FIG. 12 is a plot of signal performance for a power-saving mode.

FIG. 12 is a plot of signal performance for a power-saving mode. The circuit of FIG. 7 is operated with second loop 254 on, and all other loops off. The PSD rises continuously from the fundamental peak, rather than remaining low as in FIG. 10. However, the power consumed is reduced from 90 mW to 23 mW. SNDR is 97.9 dB and the ENOB of resolution is 16.0 bits. An additional 52 mW are saved while only another 1.4 dB is lost, or about 0.2 bits of resolution. First loop 252 is constructed from larger components, such as larger capacitors and transistors, and thus consumes more power than second loop 254.

Thus a wide range of power consumption and performance tradeoffs may be easily configured using filter-configuring muxes to the modified CIC filter, and by powering down non-selected loops.

ALTERNATE EMBODIMENTS

Several other embodiments are contemplated by the inventors. For example while muxes have been shown, other kinds of multiplexing devices may be used, such as wired-OR logic, transmission gates, switches, etc. The number of loops may be changed, and the order of each loop can be one, two, or some other order number. Modified CIC filter 200, integrators, summers, scalers, and differentiators may be implemented in various ways, FIG. 9 shows just one example; many modifications may also be made.

Latches, flip-flops, registers, and other storage devices may be inserted in the logic and data paths to allow for synchronization to clocks for timing and pipelining purposes. Buffers, capacitors, filters, resistors, and other components may also be added for various purposes.

Inversions may be added by swapping inverting and non-inverting inputs as desired, but do not change the overall function and thus may be considered equivalents. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit or powering down loops could be accomplished with additional transistors or in other ways. Pass-gate transistors or transmission gates could be added for isolation.

The final sizes of transistors and capacitors may be selected after circuit simulation or field testing. Metal-mask options or other programmable components may be used to select the final capacitor, resistor, or transistor sizes. Equalizing switches could be added between differential signals.

The location of taps or filter inputs within modified CIC filter 200 may be changed. The number of integrator stages may equal the total order (k) of all enabled loops in a cascade plus one, and the taps may be separated by a number of integrator stages equal to the order of that loop. The number of comb stages may equal the number of integrator stages. Having a CIC filter order at least one order higher than the modulator ensures that the CIC filter can filter noise from the modulator's output. The first delay in modified CIC filter 200 can be varied, depending on whether the first loop is first or second order. The first delay stage 308 may be a function of the order (j) of the first modulator loop and the overall order (k=sum of the orders of all loops). When the first-loop order is j, and the overall order is k, the first delay is $z^{-(k-j)}$. For example, when k=4 and j=2, the first delay is $z^{-2}$. The Z transform is a complex frequency domain representation of a discrete time signal. $z^{-1}$ represents one delay in the discrete time domain, while $z^{-2}$ represents 2 delays in the discrete time domain.

Summers may add positive or negative values. When a negative value is added, the summer may be considered to be a subtractor. The term "summer" is intended to include both adders and subtractors. The sigma-delta modulator and modified CIC filter can be used as an analog-to-digital converter (ADC) or in other applications.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A configurable modulator-filter comprising:
    an analog input that carries an analog input signal;
    a first sigma-delta modulator loop, receiving the analog input signal, for generating a first loop output, the first sigma-delta modulator loop summing the analog input signal and the first loop output and quantizing a first integration result to generate the first loop output;

a first filter-configuring mux, responsive to a first select signal, for generating a first filter input by selecting an input from a first group of inputs that comprises the first loop output, a second loop output, and a third loop output;

a second-loop input mux, receiving the analog input signal and the first integration result from the first sigma-delta modulator loop, for generating a second input signal by selecting the analog input signal or the first integration result in response to a second-input select signal;

a second sigma-delta modulator loop, receiving the second input signal, for generating the second loop output, the second sigma-delta modulator loop summing the second input signal and the second loop output and quantizing a second integration result to generate the second loop output;

a second filter-configuring mux, responsive to a second select signal, for generating a second filter input by selecting an input from a second group of inputs that comprises a fixed signal, the second loop output, and the third loop output;

a third-loop input mux, receiving the analog input signal and the second integration result from the second sigma-delta modulator loop, for generating a third input signal by selecting the analog input signal or the second integration result in response to a third-input select signal;

a third sigma-delta modulator loop, receiving the third input signal, for generating the third loop output, the third sigma-delta modulator loop summing the third input signal and the third loop output and quantizing a third integration result to generate the third loop output;

a third filter-configuring mux, responsive to a third select signal, for generating a third filter input by selecting an input from a third group of inputs that comprises the fixed signal, and the third loop output; and a modified Cascaded-Integrator-Comb (CIC) filter that receives the first filter input, the second filter input, and the third filter input, and generates a filter output, whereby the first, second, and third sigma-delta modulator loops are configurable by select signals to be cascaded in series or to process the analog input signal in parallel.

2. The configurable modulator-filter of claim 1 further comprising:

a first power input to the first sigma-delta modulator loop, the first power input causing the first sigma-delta modulator loop to power down when the first sigma-delta modulator loop is disabled, wherein the first loop output is not applied to the modified CIC filter when the first sigma-delta modulator loop is disabled;

a second power input to the second sigma-delta modulator loop, the second power input causing the second sigma-delta modulator loop to power down when the second sigma-delta modulator loop is disabled, wherein the second loop output is not applied to the modified CIC filter when the second sigma-delta modulator loop is disabled; and a third power input to the third sigma-delta modulator loop, the third power input causing the third sigma-delta modulator loop to power down when the third sigma-delta modulator loop is disabled, wherein the third loop output is not applied to the modified CIC filter when the third sigma-delta modulator loop is disabled.

3. The configurable modulator-filter of claim 2 further comprising:

a high-performance mode that provides a highest signal-to-noise ratio and a highest power consumption, the high-performance mode enabling the second-loop input mux to select the first integration result from the first sigma-delta modulator loop, and enabling the third-loop input mux to select the second integration result from the second sigma-delta modulator loop, wherein the first, second, and third sigma-delta modulator loops are cascaded together.

4. The configurable modulator-filter of claim 3 further comprising:

a middle mode that provides a lower signal-to-noise ratio and a lower power consumption than the high-performance mode, the middle mode enabling the second-loop input mux to select the analog input signal and enabling the third-loop input mux to select the second integration result from the second sigma-delta modulator loop;

wherein the middle mode disables and powers down the first sigma-delta modulator loop;

wherein in the middle mode the first filter-configuring mux selects the second loop output, the second filter-configuring mux selects the third loop output, and the third filter-configuring mux selects the fixed signal;

wherein the second and third sigma-delta modulator loops are cascaded together in the middle mode.

5. The configurable modulator-filter of claim 4 further comprising:

a power-saving mode that provides a lower signal-to-noise ratio and a lower power consumption than the high-performance mode and the middle mode, the power-saving mode enabling the third-loop input mux to select the analog input signal;

wherein the power-saving mode disables and powers down the first sigma-delta modulator loop and the second sigma-delta modulator loop;

wherein in the power-saving mode the first filter-configuring mux selects the third loop output, the second filter-configuring mux selects the fixed signal, and the third filter-configuring mux selects the fixed signal;

wherein the third sigma-delta modulator loop is used alone in the power-saving mode.

6. The configurable modulator-filter of claim 2 wherein the first sigma-delta modulator loop comprises:

a primary summer that adds the analog input signal and the first loop output;

a primary integrator that integrates a sum from the primary summer to generate an integrated sum;

a secondary summer that adds the integrated sum and the first loop output;

a secondary integrator that integrates a sum from the secondary summer to generate the first integration result; and a quantizer that converts the first integration result to a binary bit to generate the first loop output.

7. The configurable modulator-filter of claim 6 wherein the first sigma-delta modulator loop further comprises:

a primary scaler, coupled between the primary summer and the primary integrator, for multiplying by a first parameter; and a secondary scaler, coupled between the secondary summer and the secondary integrator, for multiplying by a second parameter.

8. The configurable modulator-filter of claim 2 wherein the first sigma-delta modulator loop, the second sigma-delta modulator loop, and the third sigma-delta modulator loop each comprise a switched-capacitor integrator.

9. The configurable modulator-filter of claim 8 wherein the switched-capacitor integrator comprises:

an op amp;

an integrating capacitor coupled between an input and an output of the op amp;
a sampling capacitor coupled between the input of the op amp and to a loop input by clocked switches; and
a summing switch coupled between the sampling capacitor and a loop output,
wherein the loop output is the first loop output for the first sigma-delta modulator loop, the second loop output for the second sigma-delta modulator loop, and the third loop output for the third sigma-delta modulator loop.

10. The configurable modulator-filter of claim 2 wherein the modified CIC filter comprises:
an initial delay stage that receives the first filter input from the first filter-configuring mux;
a plurality of integrator stages coupled to receive an output of the initial delay stage;
wherein the second filter input is applied to a second node within the plurality of integrator stages;
wherein the third filter input is applied to a third node within the plurality of integrator stages; and
a plurality of comb stages coupled to an output of the plurality of integrator stages, the plurality of comb stages generating the filter output.

11. The configurable modulator-filter of claim 10 further comprising:
a sampling switch coupled between the plurality of integrator stages and the plurality of comb stages, the sampling switch operating at a down-sampled frequency.

12. The configurable modulator-filter of claim 11 wherein the plurality of integrator stages each comprises:
an input node;
an output node;
a summer receiving the input node and driving the output node;
a feedback delay receiving the output node as an input and driving a feedback signal to an input of the summer.

13. The configurable modulator-filter of claim 12 wherein a second input stage in the plurality of integrator stages comprises a summer that also receives the second filter input;
wherein a third input stage in the plurality of integrator stages comprises a summer that also receives the third filter input.

14. The configurable modulator-filter of claim 13 wherein the plurality of comb stages each comprises:
an input node;
an output node;
a summer receiving the input node and driving the output node;
a feed-through delay receiving the input node as an input and driving a feed-through signal to an input of the summer.

15. The configurable modulator-filter of claim 2 wherein the fixed signal represents a zero value.

16. A cascade-configuring modulator-filter comprising:
a plurality of modulator loops, each modulator loop comprising:
a loop input;
a loop output;
a loop cascading output;
a first summer that combines the loop input and the loop output to generate a first sum;
a first integrator that integrates the first sum to generate the loop cascading output when the modulator loop is a first order loop, or to generate an intermediate signal when the modulator loop is a second order loop;
a quantizer coupled between the loop cascading output and the loop output;

a filter-configuring mux that generates a filter input by selecting an input selected from the loop output for a current modulator loop, and loop outputs for all modulator loops in the plurality of modulator loops after the current modulator loop, and a zero signal when the current modulator loop is not a first loop;
an input switch when the current modulator loop is not the first loop, the input switch receiving an analog input signal and the loop cascading output from a prior modulator loop in the plurality of modulator loops, the input switch passing the analog input signal to the loop input when the current modulator loop is configured as a first enabled loop, the input switch passing the loop cascading output from the prior modulator loop to the loop input when the current modulator loop is in a cascade of modulator loops;
wherein the loop input of the first loop receives the analog input signal;
a modified filter that receives the filter input from the filter-configuring mux for each modulator loop and generates a filter output;
wherein the modified filter is a modified Cascaded-Integrator-Comb (CIC) filter having a plurality of integrator stages and a plurality of comb stages and an initial stage that receives the filter input from a first filter-configuring mux for the first loop; and
a programmable register for generating control signals to the filter-configuring mux and to the input switch for the modulator loops and for generating power-down signals to power down modulator loops that are not used in a current configuration.

17. The cascade-configuring modulator-filter of claim 16 wherein when the modulator loop in the plurality of modulator loops is a second order loop, the modulator loop further comprises:
a second summer that combines the intermediate signal and the loop output to generate a second sum; and
a second integrator that integrates the second sum to generate the loop cascading output when the modulator loop is a second order loop.

18. The cascade-configuring modulator-filter of claim 17 wherein the first summer and the first integrator together comprise a switched capacitor integrator that comprises:
an op amp having an input and an output;
an integrating capacitor coupled between the input and output of the op amp;
a sampling capacitor;
an input switch coupled between a summer input and the sampling capacitor and responsive to a first phase clock;
a second switch coupled between the sampling capacitor and the input to the op amp and responsive to a second phase clock;
a feedback switch that couples the loop output to the sampling capacitor in response to the second phase clock.

19. An analog-to-digital converter comprising:
an analog input;
a plurality of modulator loops, each loop comprising:
a loop input;
a loop output;
a loop cascading output;
first summer means for combining the loop input and the loop output to generate a first sum;
first integrator means for integrating the first sum to generate the loop cascading output when the modulator loop is a first order loop, or to generate an intermediate signal when the modulator loop is a second order loop;

quantizer means for generating a digital signal on the loop output from an analog signal on the loop cascading output;

filter-configuring select means for generating a filter input by selecting an input selected from the loop output for a current modulator loop, and loop outputs for all modulator loops in the plurality of modulator loops after the current modulator loop, and a zero signal when the current modulator loop is not a first loop;

input select means, when the current modulator loop is not the first loop, for receiving an analog input signal and the loop cascading output from a prior modulator loop in the plurality of modulator loops, and for passing the analog input signal to the loop input when the current modulator loop is configured as a first enabled loop, and for passing the loop cascading output from the prior modulator loop to the loop input when the current modulator loop is in a cascade of modulator loops;

wherein the loop input of the first loop receives the analog input signal;

modified Cascaded-Integrator-Comb (CIC) filter means for filtering the filter inputs from the filter-configuring select means to generate a filter output; and programmable means for generating control signals to the filter-configuring select means and to the input select means and for generating power-down signals to power down modulator loops that are not used in a current configuration.

20. The analog-to-digital converter of claim 19 wherein the modified CIC filter means further comprises:

initial delay stage means for receiving the filter input from the filter-configuring select means for the first loop;

a plurality of integrator means for receiving an output of the initial delay stage means and successively integrating sums of intermediate nodes that receive filter inputs from other filter-configuring select means for other modulator loops, the plurality of integrator means operating in response to a sampling clock;

sampling switch means for connecting the plurality of integrator means and the plurality of comb means, the sampling switch means operating at a down-sampled frequency of a down-sampled clock; and a plurality of comb means for successively comb-filtering at the down-sampled frequency of the down-sampled clock to generate the filter output.

\* \* \* \* \*